US011942557B2

United States Patent
Yu et al.

(10) Patent No.: US 11,942,557 B2
(45) Date of Patent: Mar. 26, 2024

(54) NANOSHEET TRANSISTOR WITH ENHANCED BOTTOM ISOLATION

(71) Applicant: INTERNATIONAL BUSINESS MACHINES CORPORATION, Armonk, NY (US)

(72) Inventors: Lan Yu, Voorheesville, NY (US); Andrew M. Greene, Slingerlands, NY (US); Wenyu Xu, Albany, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 327 days.

(21) Appl. No.: 17/246,762

(22) Filed: May 3, 2021

(65) Prior Publication Data

US 2022/0352386 A1    Nov. 3, 2022

(51) Int. Cl.
*H01L 29/786* (2006.01)
*H01L 29/06* (2006.01)
*H01L 29/417* (2006.01)
*H01L 29/423* (2006.01)
*H01L 29/66* (2006.01)

(52) U.S. Cl.
CPC .... *H01L 29/78696* (2013.01); *H01L 29/0665* (2013.01); *H01L 29/41775* (2013.01); *H01L 29/42392* (2013.01); *H01L 29/66545* (2013.01)

(58) Field of Classification Search
CPC ......... H01L 29/78696; H01L 29/41775; H01L 29/0673; H01L 29/0665
See application file for complete search history.

(56) References Cited

U.S. PATENT DOCUMENTS

| | | | |
|---|---|---|---|
| 9,620,590 B1 | 4/2017 | Bergendahl | |
| 9,881,998 B1 | 1/2018 | Cheng | |
| 9,947,804 B1 | 4/2018 | Frougier | |
| 9,984,936 B1 | 5/2018 | Xie | |
| 10,074,575 B1 | 9/2018 | Guillorn | |
| 10,170,638 B1 * | 1/2019 | Reznicek | H01L 29/0649 |
| 10,312,323 B2 | 6/2019 | Cheng | |
| 10,361,269 B2 | 7/2019 | Yeung | |
| 10,453,824 B1 | 10/2019 | Mochizuki | |
| 10,461,154 B1 | 10/2019 | Song | |

(Continued)

*Primary Examiner* — Walter H Swanson
*Assistant Examiner* — Jacob T Nelson
(74) *Attorney, Agent, or Firm* — L. Jeffrey Kelly; Yuanmin Cai

(57) ABSTRACT

A semiconductor nanosheet device including semiconductor channel layers vertically aligned and stacked one on top of another, separated by a work function metal, and a second layer between two first layers, the second layer and two first layers between the semiconductor channel layers and a substrate. A semiconductor device including a lower first layer, a second layer, and a source drain region between a first set of semiconductor channel layers vertically aligned and stacked one on top of another, and a second set of semiconductor channel layers. A method including forming a stack sacrificial layer, a stack of nanosheet layers, forming a cavity by removing the stack sacrificial layer, and simultaneously forming a first layer on an upper surface of the stack sacrificial layer, on vertical side surfaces of the set of sacrificial gates, and an upper first layer and a lower first layer in a portion of the cavity.

12 Claims, 9 Drawing Sheets

(56) References Cited

U.S. PATENT DOCUMENTS

| | | | |
|---|---|---|---|
| 10,818,792 B2* | 10/2020 | Frougier | H01L 21/823468 |
| 2017/0213911 A1* | 7/2017 | Balakrishnan | H01L 29/165 |
| 2019/0287864 A1* | 9/2019 | Cheng | H01L 21/823468 |

* cited by examiner

NANOSHEET TRANSISTOR WITH ENHANCED BOTTOM ISOLATION

BACKGROUND

The present invention relates, generally, to the field of semiconductor manufacturing, and more particularly to fabricating a nanosheet field effect transistor with enhanced bottom isolation.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet FET includes a plurality of nanosheets extending between a pair of source/drain epitaxial regions. The device may be a gate all around transistor in which a gate surrounds at least a portion of the nanosheet channel.

A bottom isolation layer intended to isolate a source drain region from a substrate may become damaged by process steps performed after formation of the bottom isolation layer, reducing effectiveness of the bottom isolation layer. An improved bottom isolation layer is needed to isolate the source drain region from the substrate.

SUMMARY

According to an embodiment, a semiconductor nanosheet device is provided. The semiconductor nanosheet device including semiconductor channel layers vertically aligned and stacked one on top of another, the semiconductor channel layers separated by a work function metal, and a second layer between two first layers, the second layer and two first layers between the semiconductor channel layers and a substrate.

According to an embodiment, a semiconductor device is provided. The semiconductor device including a lower first layer on a substrate, a second layer on the lower first layer, and a source drain region on the second layer between a first set of semiconductor channel layers vertically aligned and stacked one on top of another separated by a work function metal, and a second set of semiconductor channel layers vertically aligned and stacked one on top of another separated by the work function metal.

According to an embodiment, a method is provided. The method including forming a stack sacrificial layer on a substrate, forming a stack of nanosheet layers on the stack sacrificial layer, the stack of nanosheet layers including alternating layers of a sacrificial and a semiconductor channel vertically aligned and stacked one on top of another, forming a set of sacrificial gates on the stack of nanosheet layers, forming a cavity by removing the stack sacrificial layer, and simultaneously forming a first layer on an exposed upper surface of the stack sacrificial layer, on vertical side surfaces of the set of sacrificial gates, and forming an upper first layer and a lower first layer in a portion of the cavity.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
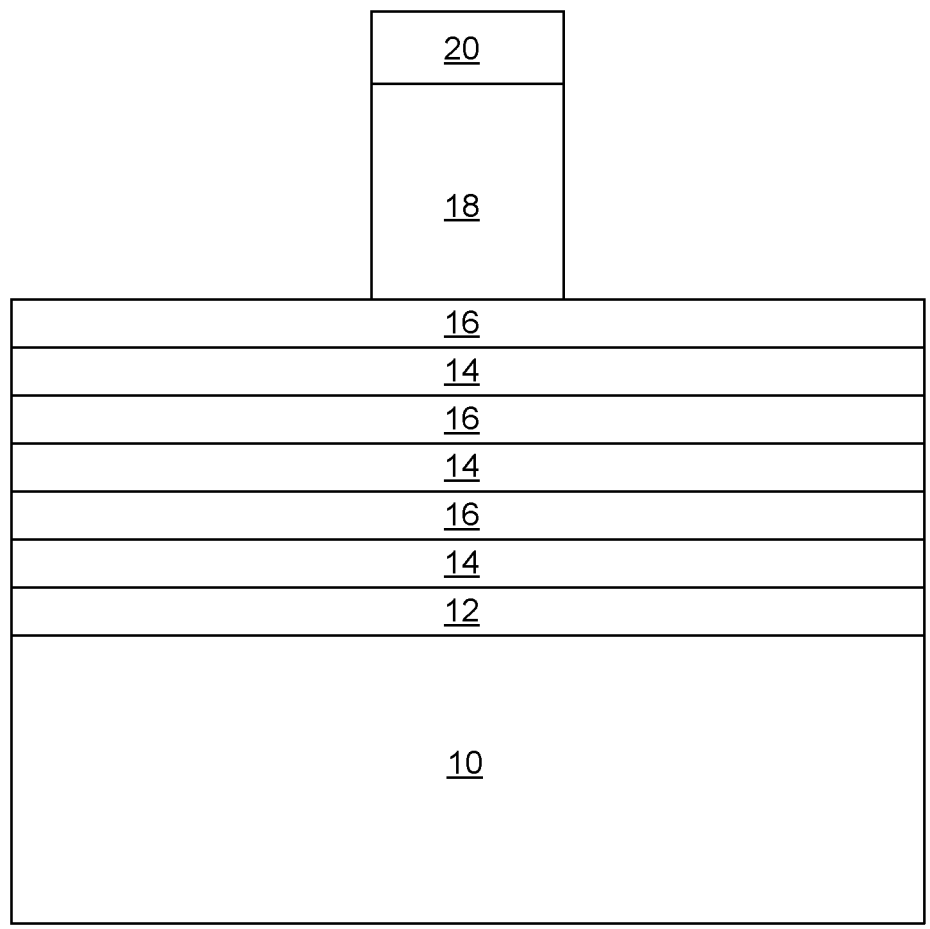
FIG. 1 illustrates a cross-sectional view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed from alternating layers of silicon and silicon germanium, which are then formed into nanosheets. A gate all around structure may be formed on all vertical sides and on a horizontal top surface of a section of the nanosheets. Source-drain structures may be formed at the opposite ends of the nanosheet structures.

The present invention relates, generally, to the field of semiconductor manufacturing, and more particularly to fabricating a nanosheet FET with an enhanced bottom dielectric isolation using an integrated source/drain etch stop layer.

Parasitic source-to-drain "punch-through" leakage through the substrate increases as the transistor gate length is scaled to 12 nm. Due to the parasitic channel below the nanosheet stack, the source drain leakage current is very challenging for nanosheet transistors to suppress. The bottom dielectric isolation (BDI) layer which separates epitaxy of the source and of the drain from touching the substrate provides a vital solution to block the leakage in the sub-nanosheet region by adding an insulator layer beneath the source drain and channel region.

A bottom isolation layer intended to isolate a source drain region from a substrate may be damaged by spacer and inner spacer formation, source/drain contact patterning and epitaxial pre-cleans. This damage can erode the BDI thickness leading back to increased source-drain leakage and degradation in device performance. An enhanced bottom isolation is needed to withstand the exposure to these aggressive processes in order to ensure the isolation of source and drain region from the substrate.

Alternating layers of a sacrificial semiconductor material and semiconductor channel material may be formed over a stack sacrificial layer and then formed into parallel nanosheet stacks. A sacrificial gate may be formed over the nanosheet stack, perpendicular to a length of the nanosheet stack. The stack sacrificial layer may be removed forming an opening. A first layer may be formed along an upper horizontal surface of the opening and along a lower horizontal surface of the opening. A second layer may fill a remaining portion of the opening, between two layers of the first layer. The first layer and the second layer may be referred to as an enhanced bottom dielectric isolation. Vertically aligned portions of the stack sacrificial layer and the nanosheet stack may be removed between adjacent sacrificial gates. A portion of the sacrificial semiconductor material layers of the nanosheet stack may be removed adjacent to where the portion of the nanosheet stack was removed, resulting in removal of the first layer above the second layer. An upper horizontal surface of the second layer may be exposed between adjacent sacrificial gates. The second layer protects the first layer above the substrate from several subsequent repeated processes such as wet etching and pre-cleans. An inner spacer may be formed where the portion of the sacrificial semiconductor material layers were removed. A source drain may be formed at the ends of the nanosheet stacks. The second layer and the first layer isolate the source drain from the substrate, preventing epitaxial growth from the substrate, reducing current leakage through the substrate. The sacrificial gate may be removed and a remaining portion of sacrificial semiconductor material layers of the nanosheet stack may be removed. A work function metal may be formed, filling the openings where the sacrificial material layers were removed and where the sacrificial gate was removed.

Embodiments of the present invention disclose a structure and a method of forming an enhanced bottom dielectric isolation utilizing an integrated source/drain etch stop layer are described in detail below by referring to the accompanying drawings in FIGS. 1-9, in accordance with an illustrative embodiment.

Referring now to FIG. 1, a semiconductor structure 100 (hereinafter "structure") at an intermediate stage of fabrication is shown according to an exemplary embodiment. FIG. 1 is a cross-sectional view of the structure 100.

The structure 100 may include alternating layers of sacrificial semiconductor material and semiconductor channel material stacked one on top of another, which may collectively be referred to as a nanosheet stack. The nanosheet stack may be on a substrate 10. A sacrificial gate 18 covered by a hard mask 20 may be on the nanosheet stack. It should be noted that, while a limited number of alternating layers are depicted, any number of alternating layers may be formed.

The substrate 10 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 10 may be approximately, but is not limited to, several hundred microns thick. In other embodiments, the substrate 10 may be a layered semiconductor such as a silicon-on-insulator or SiGe-on-insulator, where a buried insulator layer, separates a base substrate from a top semiconductor layer.

The alternating layers of sacrificial semiconductor material and semiconductor channel material may include a nanosheet stack sacrificial layer 12 (hereinafter "stack sacrificial layer") on the substrate 10, covered by a sacrificial semiconductor material layer 14 (hereinafter "sacrificial layer"), covered by a semiconductor channel material layer 16 (hereinafter "channel layer"), covered by a sacrificial layer 14, covered by a channel layer 16, covered by a sacrificial layer 14, covered by a channel layer 16. The sacrificial gate 18 may be covered by a gate hard mask 20 may be above the uppermost channel layer 16.

The stack sacrificial layer 12, may, for example, be silicon germanium with a germanium concentration about 50 atomic percent, although percentages greater than 50 percent and less than 50 percent may be used. The stack sacrificial layer 12 can be formed using an epitaxial growth technique. The stack sacrificial layer 12 will subsequently be removed selective to the remaining alternating layers, as described below.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RTCVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth of first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer 14 is composed of a first semiconductor material which differs in composition from at least an upper portion of the substrate 10, the channel layers 16 and the stack sacrificial layer 12. In an embodiment, each sacrificial layer 14 may be a silicon-germanium semiconductor alloy and have a germanium concentration less than 50 atomic percent. In another example, each sacrificial layer 14 may have a germanium concentration ranging from about 20 atomic percent to about 40 atomic percent. Each sacrificial layer 14 can be formed using known deposition techniques or an epitaxial growth technique as described above.

Each channel layer 16 is composed of a second semiconductor material which differs in composition from at least the upper portion of the substrate 10, the sacrificial layers 14 and the stack sacrificial layer 12. Each channel layer 16 has a different etch rate than the first semiconductor material of sacrificial layer 14 and has a different etch rate than the stack sacrificial layer 12. The sacrificial layer 14 has a different etch rate than the stack sacrificial layer 12. The second semiconductor material can be, for example, silicon. The second semiconductor material, for each channel layer 16, can be formed using known deposition techniques or an epitaxial growth technique as described above.

The alternating layers of sacrificial layer 14, channel layer 16 and the stack sacrificial layer 12 can be formed by sequential epitaxial growth of the nanosheet stack sacrificial layer material and alternating layers of the first semiconductor material and the second semiconductor material.

The stack sacrificial layer 12 may have a thickness ranging from about 5 nm to about 15 nm. The sacrificial layers 14 may each have a thickness ranging from about 5 nm to about 12 nm, while the channel layers 16 may each have a thickness ranging from about 3 nm to about 12 nm. Each sacrificial layer 14 may have a thickness that is the same as, or different from, a thickness of each channel layer 16. In an embodiment, each sacrificial layer 14 has an identical thickness. In an embodiment, each channel layer 16 has an identical thickness.

The stack sacrificial layer 12, the alternating layers of sacrificial layers 14 and channel layers 16 may have been formed into nanosheet stacks, by methods known in the art, by removal of portions of each layer. A trench may be formed between each nanosheet stack by an anisotropic etching technique, such as, for example, reactive ion etching (RIE), and stopping on etching a portion of the substrate 10 for subsequent formation of a shallow trench isolation region (hereinafter "STI"), not shown, between each nanosheet stack.

Each nanosheet stack may include the stack sacrificial layer 12 covered by the alternating layers of sacrificial layers 14 and channel layers 16. In FIG. 1, and only by way of an example, the nanosheet stack includes three layers of sacrificial layers 14 alternating with three layers of the channel layers 16. The material stacks that can be employed in embodiments of the present invention are not limited to the specific embodiment illustrated in FIGS. 1-9. There may be any number of nanosheet stacks on the structure 100.

The nanosheet stack is used to produce a gate all around device that includes vertically stacked semiconductor channel material nanosheets for a positive channel Field Effect Transistor (hereinafter "p-FET") or a negative channel Field Effect Transistor (hereinafter "n-FET") device.

The cross-sectional view of FIG. 1 runs along a length of the nanosheet stack, where the nanosheet stack runs from left to right. The cross-sectional view of FIG. 1 is perpendicular to the sacrificial gate 18, which crosses over the nanosheet stack perpendicular to the length of the nanosheet stack.

The sacrificial gate 18 may include a single sacrificial material or a stack of one or more sacrificial materials. The at least one sacrificial material can be formed by forming a blanket layer (or layers) of a material (or various materials) and then patterning the material (or various materials) by lithography and an etch. The sacrificial gate 18 can include any material including, for example, polysilicon, amorphous silicon, or multilayered combinations thereof. The sacrificial gate 18 can be formed using any deposition technique including, for example, chemical vapor deposition (CVD), physical vapor deposition (PVD), high density plasma (HDP) deposition, and spin on techniques. Optionally, a gate dielectric layer and a gate cap may be formed as part of the sacrificial gate 18 in accordance with known techniques. As shown in FIG. 1, there is one sacrificial gate 18. In an embodiment, there may be any number of sacrificial gates 18 formed.

In an embodiment, the sacrificial gate 18 is deposited with a thickness sufficient to fill, or substantially fill, the spaces between adjacent nanosheet structures, not shown, and cover an upper surface of the channel layer 16 of the nanosheet stack. The sacrificial gate 18 may be adjacent to vertical side surfaces of the nanosheet stack, not shown, including vertical side surfaces of the stack sacrificial layer 12, the channel layers 16 and the stack sacrificial layers 14. A height of the sacrificial gate 18 may be much thicker than the underlying structure and may have a height between 100 nm and 150 nm about the nanosheet stack.

The gate hard mask 20 may be formed over a horizontal upper surface of the sacrificial gate 18, by methods known in the art. The gate hard mask 20 may have vertical side surfaces which align with vertical side surfaces of the sacrificial gate 18.

Figure 2:
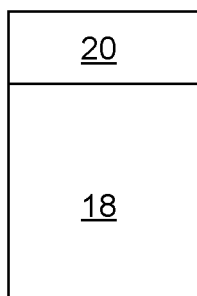
FIG. 2 illustrates selectively removing a silicon germanium layer, according to an exemplary embodiment.
Figure 2:
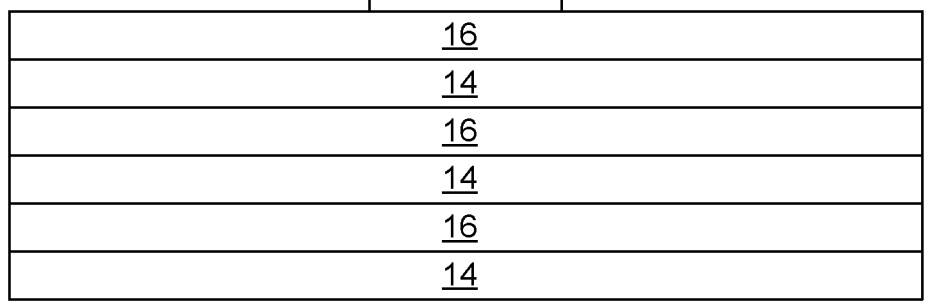
Figure 2:
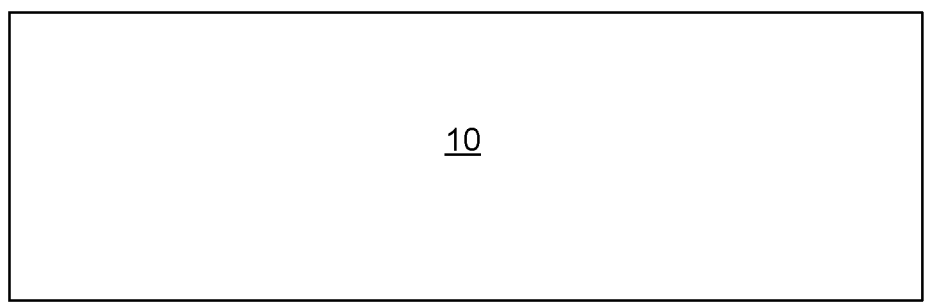

Referring now to FIG. 2, the structure 100 is shown according to an exemplary embodiment. As shown in FIG. 2, the stack sacrificial layer 12 may be selectively removed and an opening 22 may be formed where the stack sacrificial layer 12 was removed.

The stack sacrificial layer 12 may be removed selective to the substrate 10, the sacrificial layers 14, the channel layers 16, the sacrificial gate 18 and the gate hard mask 20. For example, a highly selective dry etch process can be used to selectively remove the stack sacrificial layer 12.

Figure 3:
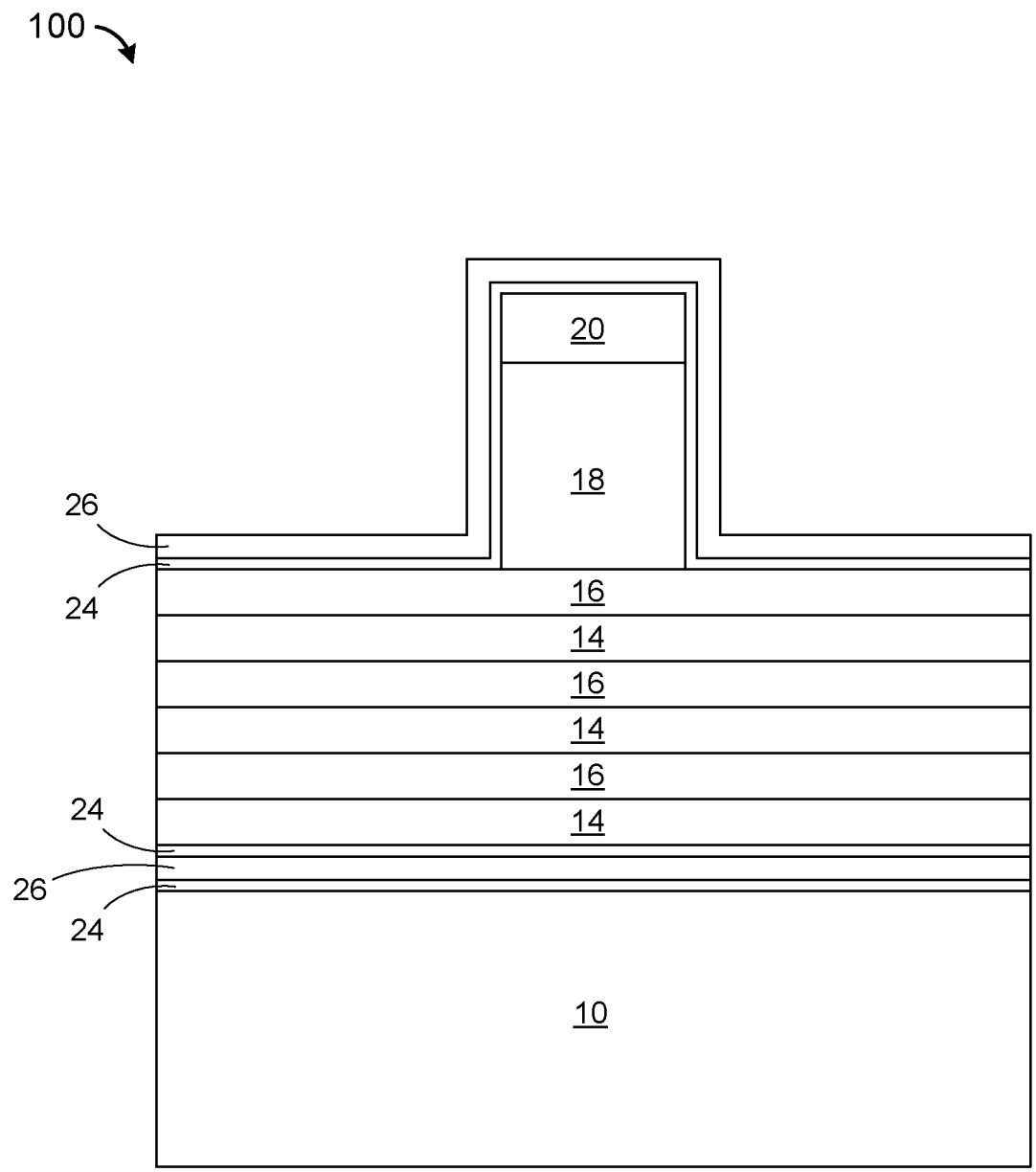
FIG. 3 illustrates forming two layers, according to an exemplary embodiment.

Referring now to FIG. 3, the structure 100 is shown according to an exemplary embodiment. As shown in FIG. 3, a first layer 24 and a second layer 26 may be formed.

The first layer 24 may form along an upper surface of the opening 22, along a lower surface of the opening 22 and cover exposed surfaces of the structure 100. The first layer 24 may cover exposed horizontal surfaces of the uppermost channel layer 16, vertical side surfaces of the sacrificial gate 18, and vertical side surfaces and an upper surface of the gate hard mask 20. The first layer 24 may not entirely fill the opening 22, leaving an innermost portion of the opening 22 open for deposition of the second layer 26 in a remainder of the opening 22, with layers of the first layer 24 above the second layer 26 and below the second layer 26, between the substrate 10 and the lowermost sacrificial layer 14.

Materials for the first layer 24 may include, but are not limited to a low-k material, for example silicon nitride (SiN), silicon boron carbonitride (SiBCN), and silicon oxycarbonitride (SiOCN).

The first layer 24 may be deposited using typical deposition techniques, for example, atomic layer deposition (ALD), molecular layer deposition (MLD), and chemical vapor deposition (CVD). The first layer 24 may have a thickness of about 3 nm, although thicknesses greater than and less than 3 nm may be acceptable.

The second layer 26 may fill in a remaining portion of the opening 22 and cover exposed surfaces of the structure 100. The second layer 26 may cover the first layer 24 over the horizontal surface of the uppermost channel layer 16, cover the first layer 24 over the vertical side surfaces of the sacrificial gate 18, and cover the first layer 24 on the vertical side surfaces and the upper surface of the gate hard mask 20.

Materials for the second layer 26 may include, but are not limited, silicon oxycarbide (SiOC), silicon carbon nitride (SiCN), silicon carbide (SiC), and aluminum oxide ($AlO_x$).

The second layer 26 may be deposited using typical deposition techniques, for example, atomic layer deposition (ALD), molecular layer deposition (MLD), and chemical vapor deposition (CVD). The second layer 26 may have a thickness of about 3 nm, although thicknesses greater than and less than 3 nm may be acceptable.

The resulting structure may include the first layer 24 over the substrate 10, the second layer 26 over the first layer 24, the first layer 24 over the second layer 26, all beneath the nanosheet stack of alternating sacrificial layers 14 and channel layers 16.

Figure 4:
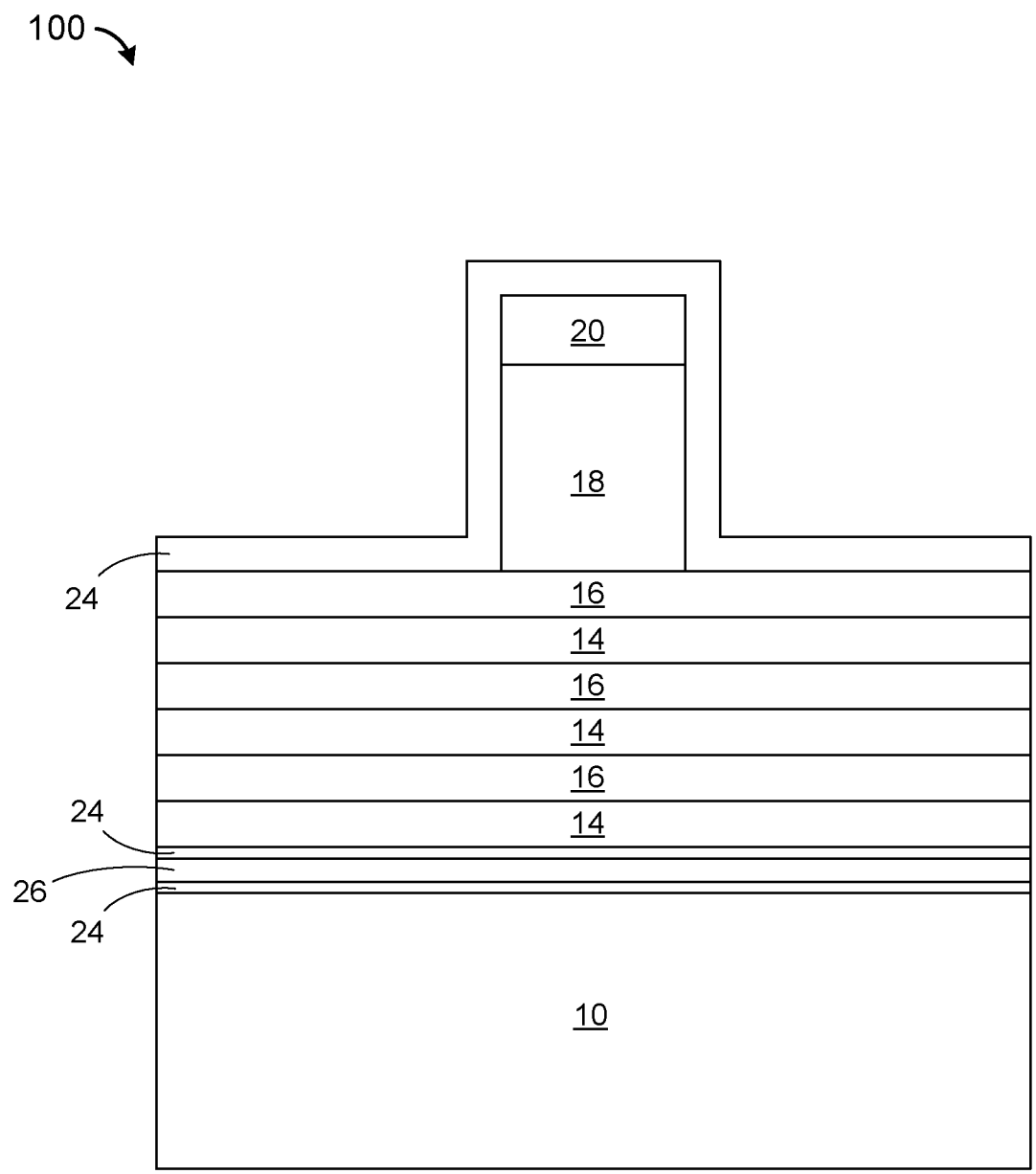
FIG. 4 illustrates selectively removing portions of one of the two layers, according to an exemplary embodiment.

Referring now to FIG. 4, the structure 100 is shown according to an exemplary embodiment. As shown in FIG. 4, portions of the second layer 26 may be removed and additional material for the first layer 24 may be formed.

The second layer 26 may be selectively removed from uppermost surfaces of the structure 100. The second layer 26 may be removed from over the first layer 24 over the horizontal surface of the uppermost channel layer 16, from over the first layer 24 over the vertical side surfaces of the sacrificial gate 18, and from over the first layer 24 on the vertical side surfaces and the upper surface of the gate hard mask 20. The second layer 26 may remain between the 2 first layers 24 below the nanosheet stack of alternating sacrificial layers 14 and channel layers 16.

The second layer 26 may be removed selective to the substrate 10, the sacrificial layers 14, the channel layers 16, the sacrificial gate 18 and the gate hard mask 20. For example, a wet etch or selective dry etching technique can be used to selectively remove the second layer 26. The second layer 26 may remain between the 2 first layers 24 below the nanosheet stack of alternating sacrificial layers 14 and channel layers 16 due to being sandwiched between the 2 first layers 24.

Additional material for the first layer 24 may be formed on exposed surfaces of the structure 100, resulting in a resulting first layer 24 which is greater than the initial deposition of the first layer 24. The additional material for the first layer 24 may be deposited over the first layer 24 over the horizontal surface of the uppermost channel layer 16, over the first layer 24 over the vertical side surfaces of the sacrificial gate 18, and over the first layer 24 on the vertical side surfaces and the upper surface of the gate hard mask 20. Material and deposition techniques may be as described above for the first layer 24.

Figure 5:
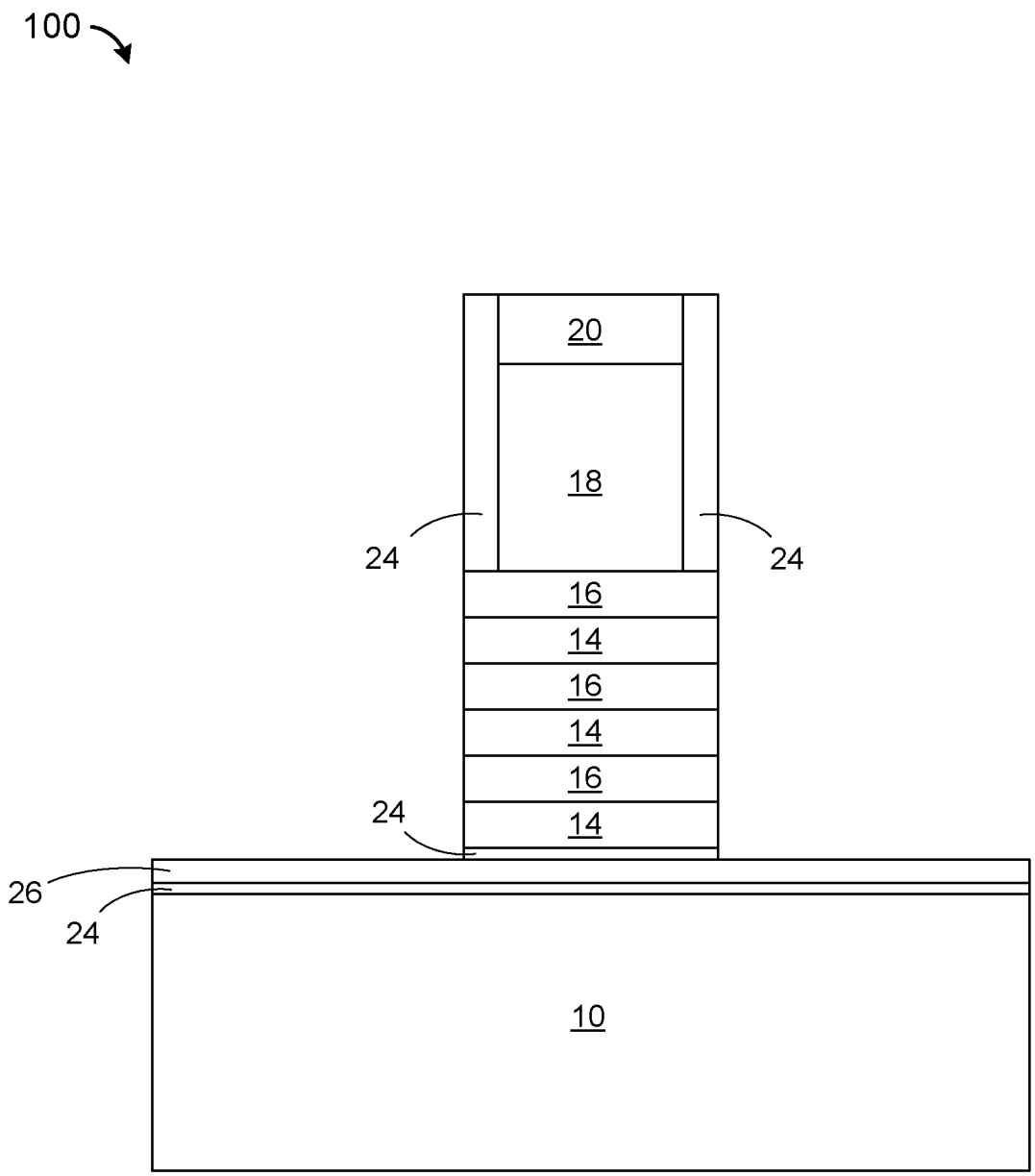
FIG. 5 illustrates selectively removing portions of the nanosheet stack, according to an exemplary embodiment.

Referring now to FIG. 5, the structure 100 is shown according to an exemplary embodiment. As shown in FIG. 5, portions of the first layer 24 and portions of the nanosheet stack may be removed.

A portion of the first layer 24 above the gate hard mask 20 and above the nanosheet stack, as well has portions of the alternating sacrificial layers 14 and channel layers 16 may be removed via etching using an anisotropic etching technique, such as, for example, reactive ion etching (RIE), and stopping at the second layer 26. The portions of the alternating sacrificial layers 14 and channel layers 16 are removed between adjacent sacrificial gates 18, not shown. A portion of the first layer 24 may also be removed between adjacent sacrificial gates 18. A portion of the second layer 26 may have an upper horizontal surface exposed between adjacent sacrificial gates 18. There may be several removal steps.

Remaining portions of the first layer 24 surrounding the sacrificial gate 18, remaining portions of the alternating sacrificial layers 14 and channel layers 16, and an additional remaining portion of the first layer 24 between the nanosheet stack and the second layer 26 may be vertically aligned.

Figure 6:
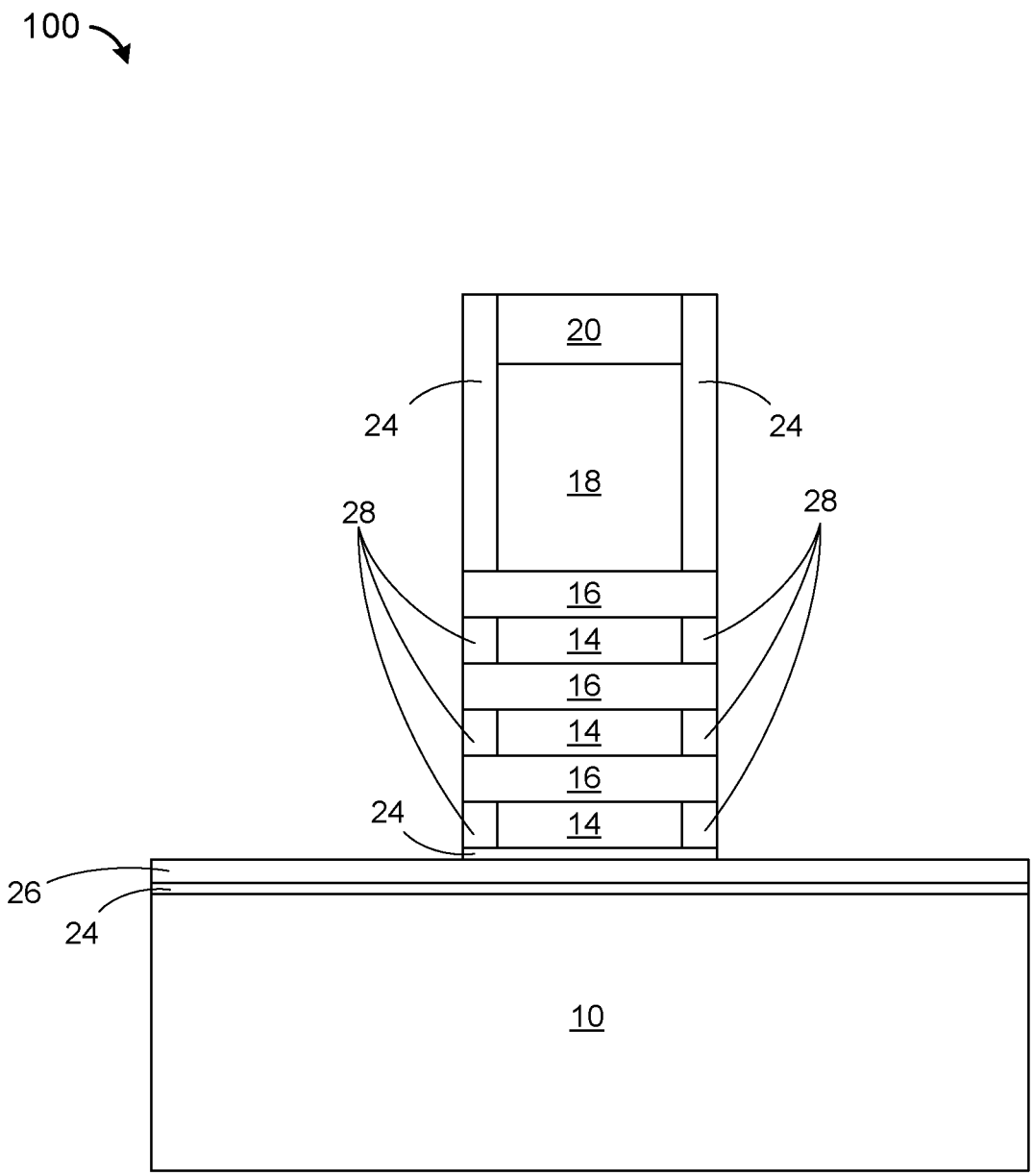
FIG. 6 illustrates selectively removing portions of sacrificial layers of the nanosheet stack and forming side spacers, according to an exemplary embodiment.

In an embodiment, the second layer 26 protects the first layer 24 between the nanosheet stack and the second layer 26 from processes such as etching of the source drain, nanosheet stack recess and inner spacer etch back, and pre-clean steps prior to forming an inner spacer as shown in FIG. 6 to prevent further etching of the first layer 24 above the substrate 10 between the sacrificial gates 18.

Referring now to FIG. 6, the structure 100 is shown according to an exemplary embodiment. As shown in FIG. 6, a further portion of each of the sacrificial layers 14 may be removed using methods known in the art. An inner spacer 28 may be formed within the indented cavity of the sacrificial layers 14.

Outer vertical sides of the inner spacer 28 may vertically align with the channel layers 16 and first layer 24 and inner vertical sides of the inner spacer 28 may vertically align with remaining portions of the sacrificial layers 14.

The inner spacer 28 may each be formed after several processes, including for example, conformally depositing or growing a dielectric and performing an isotropic etch process. The inner spacer 28 may include any dielectric material such as silicon nitride and may include a single layer or may include multiple layers of dielectric material.

Figure 7:
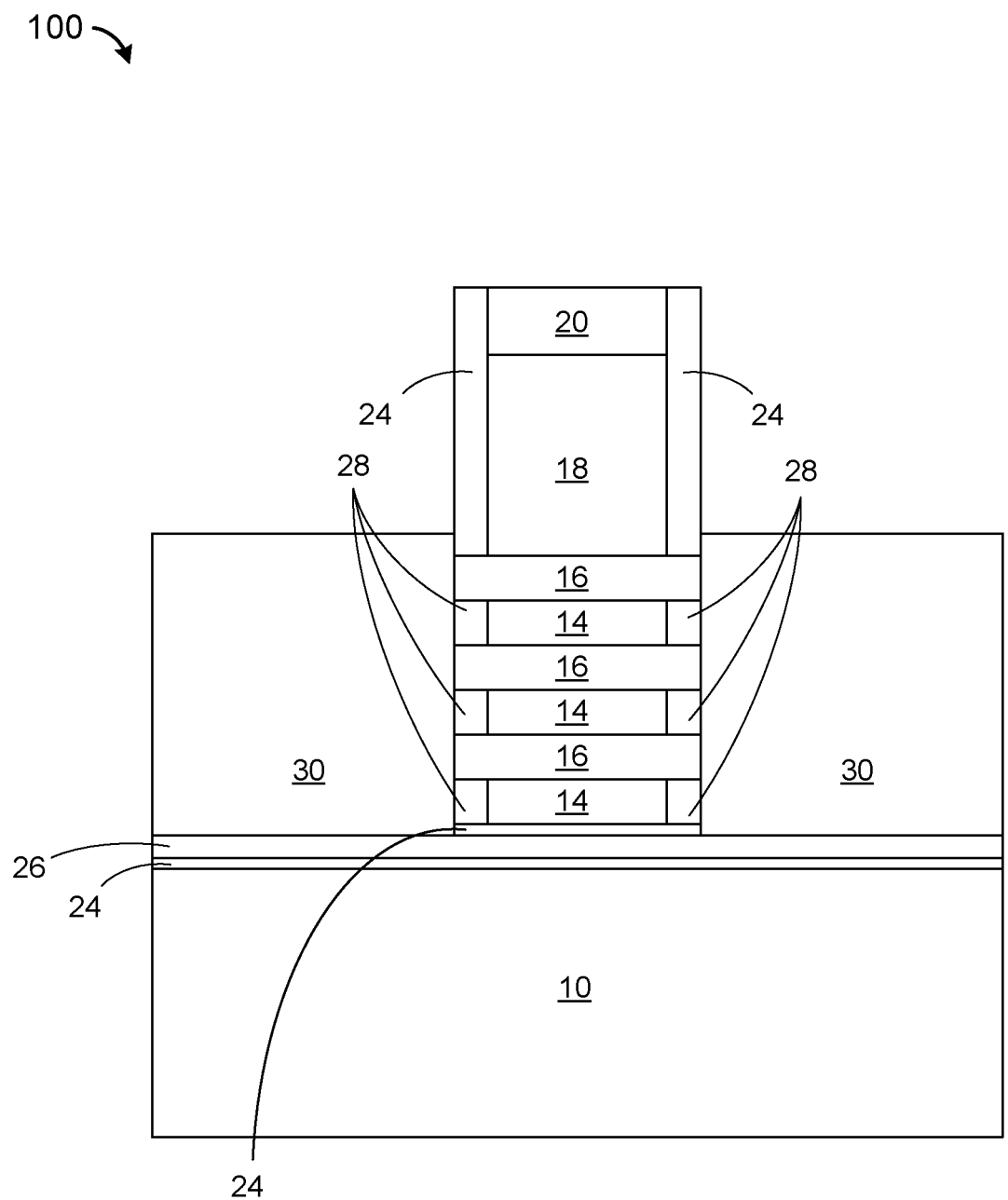
FIG. 7 illustrates epitaxially growing source drain regions, according to an exemplary embodiment.

Referring now to FIG. 7, the structure 100 is shown according to an exemplary embodiment. As shown in FIG. 7, a source drain 30 may be formed where the vertical portion of each nanosheet stack was removed, and partially recessed.

The source drain 30 may be epitaxially grown in a region on between adjacent sacrificial gates 18 and gate hard masks 20. The source drain 30 may be in direct contact with end portions of the channel layers 16 of the nanosheet stack and end portions of the inner spacer 28 surrounding the sacrificial layers 14. The source drain 30 may be formed over the second layer 26.

In an embodiment, the source drain 30 is formed over the second layer 26. The second layer 26 will isolate the source drain 30 from the substrate 10, preventing epitaxial growth from the substrate 10. This critical feature withstands epitaxial patterning and pre-cleaning steps to prevent erosion and thinning. This will reduce current leakage through the substrate 10.

Figure 8:
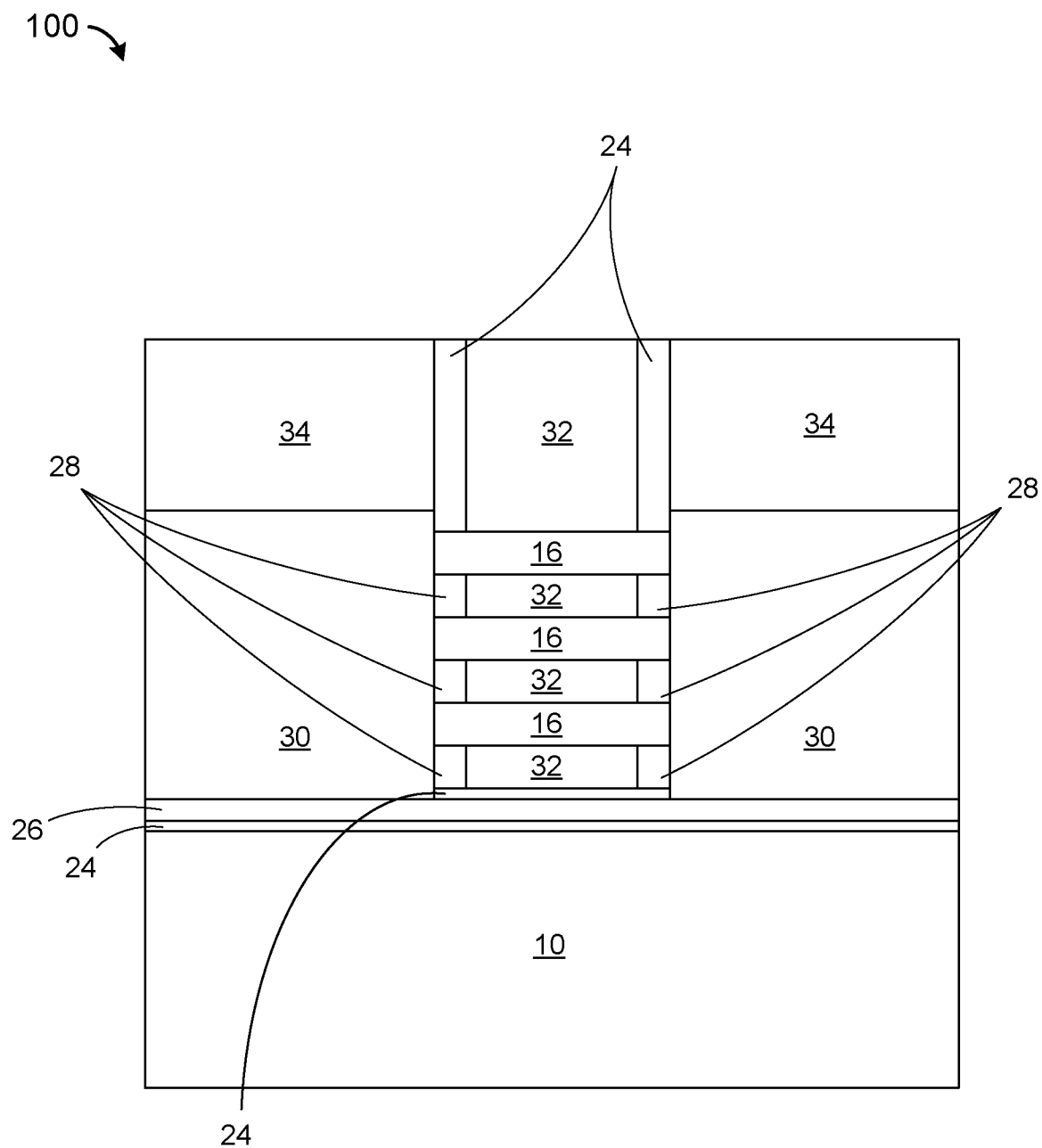
FIGS. 8 and 9 illustrate a replacement gate process, according to an exemplary embodiment.
Figure 9:
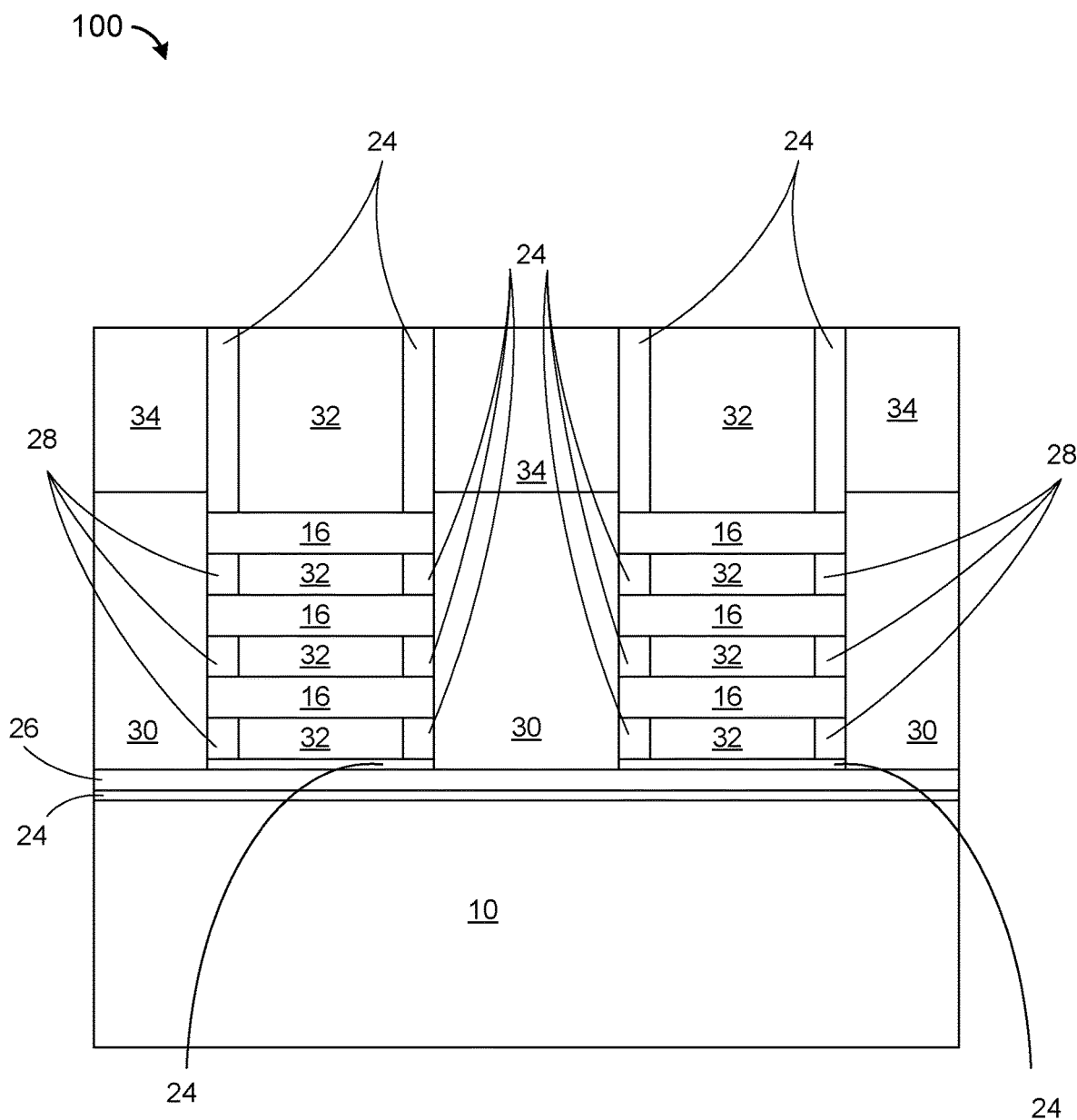

Referring now to FIGS. 8 and 9, the structure 100 is shown according to an exemplary embodiment. As shown in FIGS. 8 and 9, a dielectric 34 may be formed, the sacrificial gate 18 may be removed, the sacrificial layers 14 may be removed and a work function metal (hereinafter "WFM") 32 may be formed.

The WFM 32 is formed in each cavity of the nanosheet stack where the sacrificial layers 14 were removed, and the WFM 32 surrounds suspended portions of the channel layers 16.

The WFM 32 may fill a remainder of openings where the sacrificial gate 18 was removed between adjacent first layers 24 over the nanosheet stack.

The WFM 32 may be deposited using typical deposition techniques, for example, atomic layer deposition (ALD), molecular layer deposition (MLD), and chemical vapor deposition (CVD). In an embodiment, the work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics.

After forming the WFM 32, a chemical mechanical polishing (CMP) technique may be used to remove excess material and polish upper surfaces of the structure 100 such that upper horizontal surfaces of the WFM 32, the first layer 24 and the dielectric 34 are coplanar.

In an embodiment, forming the stack sacrificial layer 12 beneath the nanosheet stack of alternating sacrificial layers 14 and channel layers 16 and then replacing the stack sacrificial layer 12 with the second layer 26 between two layers of the first layer 24 has several benefits.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor nanosheet device comprising:
    semiconductor channel layers vertically aligned and stacked one on top of another, the semiconductor channel layers separated by a work function metal; and
    a second layer sandwiched between two first layers, the second layer and the two first layers are below the semiconductor channel layers and above a substrate, wherein vertical side surfaces of the semiconductor channel layers are vertically aligned with vertical side surfaces of an upper layer of the two first layers, wherein a combined thickness of the second layer and the two first layers is approximately the same as a thickness of the work function metal between the semiconductor channel layers.

2. The semiconductor nanosheet device according to claim 1, wherein
    the second layer and a lower layer of the two first layers extend vertically beyond the semiconductor nanosheet device.

3. The semiconductor nanosheet device according to claim 2, further comprising:
    source drain regions extending laterally from opposite ends of the semiconductor channel layers, wherein the source drain regions are above the second layer over the substrate.

4. The semiconductor nanosheet device according to claim 1, further comprising:
    inner spacers surrounding both vertical side surfaces of the work function metal, wherein the vertical side surface of the inner spacers are vertically aligned with vertical side surfaces of the semiconductor channel layers, wherein the inner spacers comprise silicon nitride.

5. The semiconductor nanosheet device according to claim 1, further comprising:
    source drain regions extending laterally from opposite ends of the semiconductor channel layers.

6. A semiconductor device comprising:
    a lower first layer on a substrate;
    a second layer on the lower first layer;
    an upper first layer on the second layer; and
    a source drain region on the second layer between a first set of semiconductor channel layers vertically aligned and stacked one on top of another separated by a work function metal, and a second set of semiconductor channel layers vertically aligned and stacked one on top of another separated by the work function metal, wherein vertical side surfaces of the semiconductor channel layers are vertically aligned with vertical side surfaces of the upper first layer, in both the first set of semiconductor channel layers and the second set of semiconductor channel layers, wherein a combined thickness of the lower first layer, the second layer and the upper first layer is approximately the same as a thickness of the work function metal between the semiconductor channel layers in both the first set of semiconductor channel layers and the second set of semiconductor channel layers.

7. The semiconductor device according to claim 6, further comprising:
    inner spacers surrounding both side surfaces of the work function metal in both the first set of semiconductor channel layers and the second set of semiconductor channel layers, wherein the vertical side surface of the inner spacers are vertically aligned with the vertical side surfaces of the semiconductor channel layers, wherein the inner spacers comprise silicon nitride.

8. The semiconductor device according to claim 6,
    wherein the source drain regions are above the second layer on the substrate.

9. A semiconductor nanosheet device comprising:
    a stack of isolation layers on top of a substrate, the stack of isolation layers comprising a first dielectric layer, a second dielectric layer, and a third dielectric layer stacked in order one atop another, the first dielectric layer and the third dielectric layer having identical composition;

a stack of semiconductor channel layers directly on the stack of isolation layers and stacked one above another; and work function metal layers between and separating each semiconductor channel layer of the stack of semiconductor channel layers, wherein a width of the work function metal layers is less than a width of the stack of semiconductor channel layers, wherein vertical side surfaces of the semiconductor channel layers are vertically aligned with vertical side surfaces of the third dielectric layer, wherein a combined thickness of the first dielectric layer, the second dielectric layer and the third dielectric layer is approximately the same as a thickness of the work function metal layers between each semiconductor channel layer of the stack of semiconductor channel layers.

10. The semiconductor nanosheet device according to claim 9, wherein the first dielectric layer and the second dielectric layer extend horizontally beyond the stack of semiconductor channel layers.

11. The semiconductor nanosheet device according to claim 10, further comprising:

source drain regions extending laterally from opposite ends of the semiconductor channel layers, wherein a bottommost surface of the source drain regions directly contacts a topmost surface of the second layer over the substrate.

12. The semiconductor nanosheet device according to claim 10, further comprising:

inner spacers surrounding both side surfaces of each of the work function metal layers, wherein vertical side surfaces of the inner spacers are vertically aligned with vertical side surfaces of the semiconductor channel layers, wherein the inner spacers comprise silicon nitride.

* * * * *